United States Patent
Liu et al.

(10) Patent No.: US 12,490,630 B2
(45) Date of Patent: Dec. 2, 2025

(54) LIGHT-TRANSMITTING DISPLAY PANEL, DISPLAY PANEL, AND DISPLAY DEVICE

(71) Applicant: KunShan Go-Visionox Opto-Electronics Co., Ltd, Jiangsu (CN)

(72) Inventors: Rusheng Liu, Kunshan (CN); Jingsong Tang, Kunshan (CN); Rubo Xing, Kunshan (CN); Jianping Chen, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 395 days.

(21) Appl. No.: 17/499,070

(22) Filed: Oct. 12, 2021

(65) Prior Publication Data

US 2022/0029125 A1    Jan. 27, 2022

Related U.S. Application Data

(63) Continuation of application No. PCT/CN2020/085136, filed on Apr. 16, 2020.

(30) Foreign Application Priority Data

Sep. 24, 2019   (CN) .......................... 201910906894.3

(51) Int. Cl.
    *H10K 59/65*     (2023.01)
    *H10K 59/122*     (2023.01)
    *H10K 59/80*     (2023.01)

(52) U.S. Cl.
    CPC ........... *H10K 59/65* (2023.02); *H10K 59/122* (2023.02); *H10K 59/80515* (2023.02);
    (Continued)

(58) Field of Classification Search
    CPC .. H10K 50/818; H10K 59/122; H10K 50/822; H10K 50/805–818; H10K 59/65;
    (Continued)

(56) References Cited

U.S. PATENT DOCUMENTS

2008/0026499 A1    1/2008   Moriya et al.
2016/0240811 A1*   8/2016   Kim .................. H10K 59/80524
(Continued)

FOREIGN PATENT DOCUMENTS

CN      104730750 A      6/2015
CN      104813499 A      7/2015
(Continued)

OTHER PUBLICATIONS

Zhao, Gai-na, CN-111009619-A Translation of FOR Document, Apr. 14, 2020 (Year: 2020).*

(Continued)

*Primary Examiner* — Jacob Y Choi
*Assistant Examiner* — Ashley Nicole Blackwell
(74) *Attorney, Agent, or Firm* — Maier & Maier, PLLC

(57) ABSTRACT

A light-transmitting display panel, a display panel, a manufacturing method, and a display device. The light-transmitting display panel includes: a substrate; and a light-emitting element layer disposed on the substrate. The light-emitting element layer includes a plurality of first electrodes, a plurality of first light-emitting structures disposed on the first electrodes, and a plurality of second electrode assemblies disposed on the first light-emitting structures. The second electrode assemblies include: a plurality of second electrodes disposed on the first light-emitting structures and having a plurality of openings; and a plurality of light-transmitting blocks disposed in the openings of the second electrodes. A material of the light-transmitting blocks non-binds with a material of the second electrodes.

18 Claims, 7 Drawing Sheets

(52) U.S. Cl.
CPC . *H10K 59/80521* (2023.02); *H10K 59/80518* (2023.02); *H10K 59/80524* (2023.02)

(58) Field of Classification Search
CPC ....... H10K 59/80515; H10K 59/80521; H10K 59/80518; H10K 59/80524; H10K 59/121
USPC .......................................................... 257/40
See application file for complete search history.

(56) References Cited

U.S. PATENT DOCUMENTS

| | | | | |
|---|---|---|---|---|
| 2020/0211425 | A1* | 7/2020 | Yamazaki | G09F 9/30 |
| 2020/0251539 | A1* | 8/2020 | Fu | H10K 59/352 |
| 2021/0013277 | A1* | 1/2021 | Liu | H10K 59/353 |
| 2021/0167326 | A1* | 6/2021 | Waki | H10K 50/844 |

FOREIGN PATENT DOCUMENTS

| | | | | |
|---|---|---|---|---|
| CN | 108470756 | A | | 8/2018 |
| CN | 108717244 | A | | 10/2018 |
| CN | 208608202 | U | | 3/2019 |
| CN | 109801950 | A | | 5/2019 |
| CN | 110061014 | A | | 7/2019 |
| CN | 110071160 | A | | 7/2019 |
| CN | 110783485 | A | | 2/2020 |
| CN | 111009619 | A | * | 4/2020 ....... H01L 27/73232 |

OTHER PUBLICATIONS

International Search Report issued on Jul. 15, 2020 in corresponding International application No. PCT/CN2020/085136; 9 pages.
First Office Action issued on Jun. 22, 2020 in corresponding Chinese application No. 201910906894.3; 13 pages including Partial English-language translation.
Second Office Action issued on Aug. 25, 2020 in corresponding Chinese application No. 201910906894.3; 10 pages Including Partial English-language translation.

\* cited by examiner

LIGHT-TRANSMITTING DISPLAY PANEL, DISPLAY PANEL, AND DISPLAY DEVICE

CROSS REFERENCE TO RELATED APPLICATIONS

The present application is a continuation of International Application No. PCT/CN2020/085136 filed on Apr. 16, 2020, which claims priority to Chinese patent application No. 201910906894.3 filed on Sep. 24, 2019, both of which are incorporated herein by reference in their entireties.

TECHNICAL FIELD

The present application relates to the field of display technology, in particular to a light-transmitting display panel, a display panel, and a display device.

BACKGROUND

The latest development direction of a smart electronic product is to have a higher screen-to-body ratio. In order to increase the screen-to-body ratio, it is required that multiple sensors on the front of an electronic product should be integrated under a light-transmitting display panel of the electronic product. Currently, some devices such as a fingerprint recognition device and an earpiece or the like have be well integrated under the light-transmitting display panel, but a problem of integrating a front camera of the electronic product have not been well solved.

Regarding integration of the front camera, a conventional solution is to open a groove or punch a hole on the light-transmitting display panel at a location corresponding to the camera, but this will cause an problem that the light-transmitting display panel cannot display information in a grooved or opened area.

SUMMARY

The present application provides a light-transmitting display panel and a manufacturing method for the light-transmitting display panel, a display panel and a display device.

In a first aspect, the embodiments of the present application provides a light-transmitting display panel, including: a substrate; and a light-emitting element layer disposed on the substrate, wherein the light-emitting element layer includes a plurality of first electrodes, a plurality of first light-emitting structures disposed on the first electrodes, and a plurality of second electrode assemblies disposed on the first light-emitting structures. The second electrode assemblies include: a plurality of second electrodes disposed on the first light-emitting structures and having a plurality of openings; and a plurality of light-transmitting blocks disposed in the openings of the second electrodes and a material of the light-transmitting blocks nonbinds with a material of the second electrodes.

According to the light-transmitting display panel in the embodiment of the present application, the second electrodes of the second electrode assemblies have a plurality of openings and the light-transmitting blocks are provided within the openings, so that an overall light transmittance of the second electrode assemblies can be increased, and thus a photosensitive component can be integrated on a backside of the light-transmitting display panel to realize under-screen integration of a photosensitive component such as a camera, and further the light-transmitting display panel can display images, so a full-screen design of a display device can thus be achieved. The material of the second electrodes nonbinds with the material of the light-transmitting blocks, so during formation of the second electrodes, it can be prevented that any film would be formed in an area including the light-transmitting blocks due to nonbinding of the two materials, which enables precisely implementation of patterning of the second electrodes.

In a second aspect, the embodiments of the present application provides a display panel, including a first display area and a second display area, wherein a light transmittance of the first display area is greater than a light transmittance of the second display area, and wherein the first display area is provided with the light-transmitting display panel according to any foregoing implementation in the first aspect.

According to the display panel in the embodiment of the present application, a light transmittance of the first display area is greater than a light transmittance of the second display area, so that a photosensitive component can be integrated on a backside of the first display area of the display panel to realize under-screen integration of a photosensitive component such as a camera, and further the first display area can display images to increase a display area of the display panel, so a full-screen design of a display device can thus be achieved. In the first display area, the second electrodes of the second electrode assemblies include a plurality of openings and the light-transmitting blocks are disposed in the openings of the second electrodes, so that an overall light transmittance of the second electrode assemblies can be increased, and thus a photosensitive component can be integrated on a backside of the first display area to realize under-screen integration of a photosensitive component such as a camera, and further the first display area can display images, so a full-screen design of a display device can thus be achieved. The material of the second electrode nonbinds with the material of the light-transmitting block, so during formation of the second electrodes, it can be prevented that any film would be formed in an area including the light-transmitting blocks due to nonbinding of the two materials, which enables precisely implementation of patterning of the second electrodes.

In a third aspect, the embodiments of the present application provides a display device, including the light-transmitting display panel according to any of foregoing implementations.

BRIEF DESCRIPTION OF THE DRAWINGS

By reading the following detailed description of the non-limiting embodiments with reference to the accompanying drawings, other features, purposes and advantages of the present application will become more apparent, wherein the same or similar reference signs indicate the same or similar features, and the figures may not be drawn to an actual scale.

DETAILED DESCRIPTION

In a smart electronic device such as a mobile phone or a tablet computer, it is required that a photosensitive component such as a front camera, an infrared light sensor or a proximity light sensor is integrated on a side where a display panel is set. In some embodiments, a light-transmitting display area can be provided on the above-mentioned electronic device and the photosensitive component is provided under the light-transmitting display area, so that full-screen display of the electronic device can be realized while ensuring normal operation of the photosensitive component.

In a conventional display panel with such a light-transmitting display area, a light transmittance of a cathode corresponding to a light-emitting area should not be too high but should be within an appropriate range in order to ensure a display effect of the light-emitting area in the light-transmitting display area. Thus, the light transmittance of the cathode would be affected, and thereby a light transmittance of the entire light-transmitting display area cannot be improved.

In order to solve the above-mentioned problem, the embodiments of the present application provide a light-transmitting display panel and a manufacturing method for the light-transmitting display panel, a display panel and a manufacturing method for the display panel, and a display device. The embodiments of the light-transmitting display panel and the manufacturing method for the light-transmitting display panel, the display panel and the manufacturing method for the display panel, and the display device will be described below with reference to the accompanying drawings.

The embodiments of the present application provides a light-transmitting display panel, which may be an organic light emitting diode (OLED) light-transmitting display panel. The light-transmitting display panel in the embodiments of the present application will be described in detail below with reference to the accompanying drawings.

In the present application, it is preferable that the light-transmitting display panel has a light transmittance of 15% or greater than 15%. In order to ensure that the light-transmitting display panel has a light transmittance of greater than 15%, even greater than 40%, and even has a higher light transmittance, at least a part of functional film layers of the light-transmitting display panel has a light transmittance of greater than 80% in the embodiments, and even at least a part of the functional film layers has a light transmittance of greater than 90%.

Figure 1:
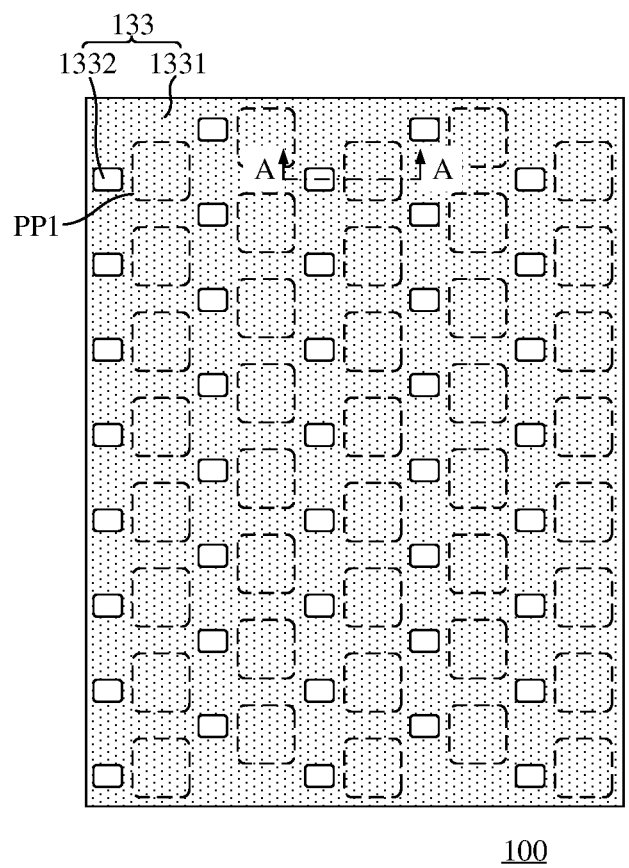
FIG. 1 is a schematic top view of a light-transmitting display panel according to an embodiment of the present application.
Figure 2:
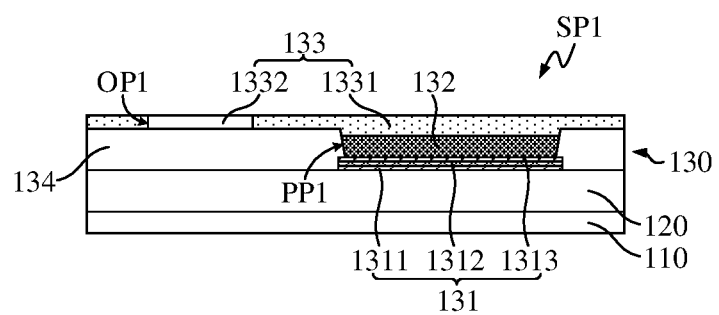
FIG. 2 is a cross-sectional view taken along the line A-A in FIG. 1.

FIG. 1 is a schematic top view of a light-transmitting display panel according to an embodiment of the present application, and FIG. 2 is a cross-sectional view taken along the line A-A in FIG. 1. The light-transmitting display panel 100 includes a substrate 110 and a light-emitting element layer 130 on the substrate 110. In some embodiments, the light-transmitting display panel 100 may further include a device layer 120. The device layer 120 is provided on the substrate 110, and the light-emitting element layer 130 is provided on the device layer 120.

The substrate 110 may include a light-transmitting material such as glass or polyimide (PI) or the like. The device layer 120 may include pixel circuits for driving respective sub-pixels to display, and the device layer 120 may be configured as a transparent layer structure. The light-emitting element layer 130 is used to form a plurality of first light-emitting elements SP1.

In an implementation, the light-transmitting display panel 100 may further include an encapsulation layer as well as both a polarizer and a cover plate above the encapsulation layer, or the cover plate may be provided directly above the encapsulation layer without the polarizer so as to prevent an influence of the polarizer on a light collection amount of a photosensitive element correspondingly under the light-transmitting display panel 100. Of course, the polarizer may also be provided above the encapsulation layer of the light-transmitting display panel 100.

In an implementation, the light-emitting element layer 130 may include a plurality of first electrodes 131, a plurality of first light-emitting structures 132 disposed on the first electrodes 131, and a plurality of second electrode assemblies 133 disposed on the first light-emitting structures 132. One of the first electrode 131 and the second electrode assembly 133 acts as an anode, and the other acts as a cathode. In the embodiment, a case where the first electrode 131 acts as an anode and the second electrode assembly 133 acts as a cathode is taken as an example for description. Each first electrode 131, together with a corresponding first light-emitting structure 132 and a second electrode assembly 133 in an area corresponding to the first light-emitting structure 132, forms a first light-emitting element SP1, which may be, for example, an OLED light-emitting element.

In the embodiment, the second electrode assemblies 133 include a plurality of second electrodes 1331 and a plurality of light-transmitting blocks 1332. The second electrodes 1331 are disposed on the first light-emitting structures 132 and have a plurality of openings OP1, and the light-transmitting blocks 1332 are disposed in the openings OP1 of the second electrodes 1331. A material of the light-transmitting block 1332 nonbinds with a material of the second electrode 1331.

In the present application, regarding binding-nonbinding relationship between two materials, when it is nonbinding, it refers to a physical nature of mutual repulsion between molecules of the two materials. In the embodiments of the present application, a second material being nonbinding with a first material among two materials means that the second material will not be spread on a surface of the first material when the second material is being evaporated on the surface of the first material.

According to the light-transmitting display panel 100 in the embodiment of the present application, the second electrodes 1331 in the second electrode assemblies 133 include the plurality of openings OP1 and the light-transmitting blocks 1332 are disposed in the openings OP1, so that an overall light transmittance of the second electrode assemblies 133 can be increased, and thus a photosensitive component can be integrated on a backside the light-transmitting display panel 100 to realize under-screen integration of a photosensitive component such as a camera, and further the light-transmitting display panel can display images, so a full-screen design of a display device can thus be achieved.

The material of the light-transmitting block 1332 non-binds with the material of the second electrode 1331, so during formation of the second electrodes 1331, it can be prevented that any film would be formed in an area including the light-transmitting blocks 1332 due to the nonbinding between the two materials, which enables precisely implementation of patterning of the second electrodes 1331.

In an implementation, the light-transmitting blocks 1332 may have a light (visible light) transmittance of 90% or greater, so as to further increase an average light transmittance of the second electrode assemblies 133, thereby increasing the light transmittance of the light-transmitting display panel 100.

In an implementation, the material of the light-transmitting block 1332 may be, for example, an organic material such as Conductor Patterning Materials (CPM), and the light-transmitting block 1332 may be formed by evaporation through a fine metal mask (Fine Metal Mask, FMM). In an implementation, the light-transmitting blocks 1332 may have a thickness of 50 nanometers to 300 nanometers, preferably 80 nanometers to 130 nanometers, for example, 100 nanometers.

The material of the second electrodes 1331 may be metal-like material such as Conductor Electrode Materials (CEM), for example, a magnesium-silver alloy. The CEM has a film-forming property that any film cannot be formed on the CPM, and has electrical and optical properties that are similar as electrical and optical properties of a conventional cathode. In an implementation, the second electrodes 1333 may have a thickness of 5 nanometers to 20 nanometers, preferably 10 nanometers to 16 nanometers, for example, 13 nanometers.

In an implementation, the light-emitting element layer 130 may further include a pixel definition layer 134. The pixel definition layer 134 includes a plurality of first pixel openings PP1, and each of the first pixel openings PP1 accommodates a corresponding first light-emitting structure 132. In FIG. 1, outlines of the first pixel openings PP1 are shown by dotted lines. The light-transmitting blocks 1332 and the first pixel openings PP1 are staggered with each other on a plane parallel to the substrate 110, so that high light-transmittance areas and light-emitting areas of the second electrode assemblies 133 avoid each other, to ensure a higher display effect of the light-transmitting display panel 100 while achieving a higher light transmittance.

In an implementation, the first pixel openings PP1 are adjacent to the light-transmitting blocks 1332, and each of the first pixel openings PP1 may be surrounded by corresponding ones of the light-transmitting blocks 1332, or each of the light-transmitting blocks 1332 may be surrounded by corresponding ones of the first pixel openings PP1.

In an implementation, the light-transmitting blocks 1332 may be configured in a plurality of columns, the first pixel openings PP1 may be configured in a plurality of columns, and the plurality of columns of the light-transmitting blocks 1332 and the plurality of columns of the first pixel openings PP1 alternate with one another.

In an implementation, an irregularly shaped spacer region may be configured between orthographic projections of the first light-emitting structures 132 on the substrate 110 and orthographic projections of the light-transmitting blocks 1332 adjacent to the first light-emitting structures on the substrate 110, so as to improve diffraction of the light-transmitting display panel 100, thereby improving display effects of the light-transmitting display panel 100.

In an implementation, the orthographic projection of the light-transmitting block 1332 on the substrate 110 may be a rectangle. In an implementation, the orthographic projection of the light-transmitting block 1332 on the substrate 110 may be any other shape.

Figure 3:
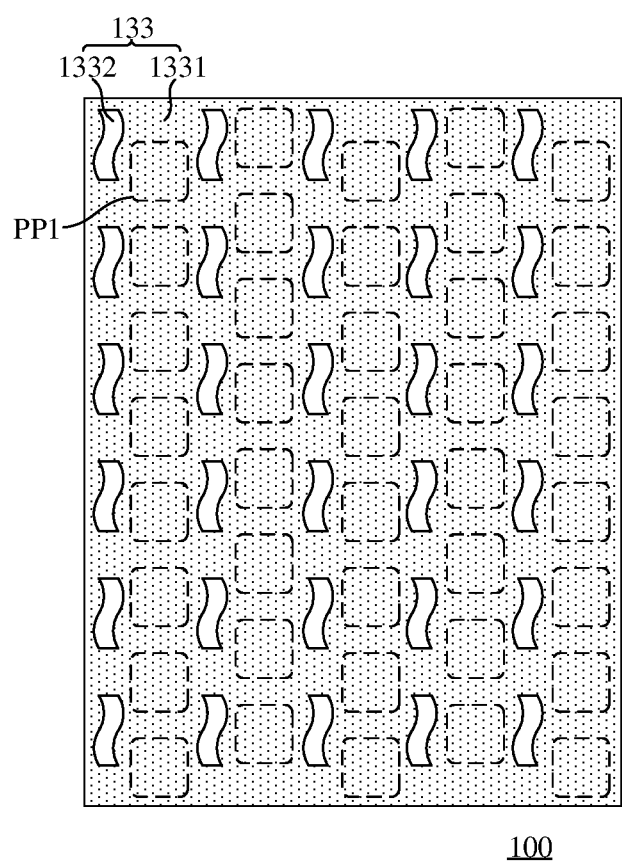
FIG. 3 is a schematic top view of a light-transmitting display panel according to an embodiment of the present application.

FIG. 3 is a schematic top view of a light-transmitting display panel according to an alternative embodiment of the present application. In the alternative embodiment, the orthographic projection of the light-transmitting block 1332 on the substrate 110 may be a wave-like shape. In an implementation, the orthographic projection of the light-transmitting block 1332 on the substrate 110 may also be any other shape. Each of the orthographic projections of the light-transmitting blocks 1332 on the substrate 110 consists of a first graphic unit or of two or more first graphic units. The first graphic unit includes at least one selected from a group consisting of a polygon, a dumbbell-like shape, a gourd-like shape, and a wavy-like shape.

In an implementation, each of the orthographic projections of the first light-emitting structure 132 on the substrate 110 may consist of a second graphic unit or two or more second graphic units. The second graphic unit includes at least one selected from a group consisting of a circle, an ellipse, a dumbbell-like shape, a gourd-like shape, and a rectangle.

By adjusting and designing the shape of the first light-emitting structure 132 and the light-transmitting block 1332, diffraction of the light-transmitting display panel 100 can be improved, thereby improving display effects of the light-transmitting display panel 100.

In an implementation, the first light-emitting structure 132 may include an OLED light-emitting layer. According to design requirements for the first light-emitting structure 132, it may further include at least one of a hole injection layer, a hole transportation layer, an electron injection layer, and an electron transportation layer.

In an implementation, the first electrodes 131 may be light-transmitting electrodes, and may have a material such as indium tin oxide (ITO), indium zinc oxide, or the like.

In an implementation, the first electrode 131 may be a reflective electrode, and may include a first light-transmitting conductive layer 1311, a first reflective layer 1312 disposed on the first light-transmitting conductive layer 1311, and a second light-transmitting conductive layer 1313 disposed on the first reflective layer 1312. The first light-transmitting conductive layer 1311 and the second light-transmitting conductive layer 1313 may be ITO, indium zinc oxide, or the like, and the first reflective layer 1312 may be a metal layer, for example, made of silver. The second electrodes 1331 may be magnesium-silver alloy layers.

The embodiments of the present application also provide a manufacturing method for a light-transmitting display panel. The manufacturing method will be described below by taken manufacture of the light-transmitting display panel 100 in the foregoing embodiment as an example.

Figure 4:
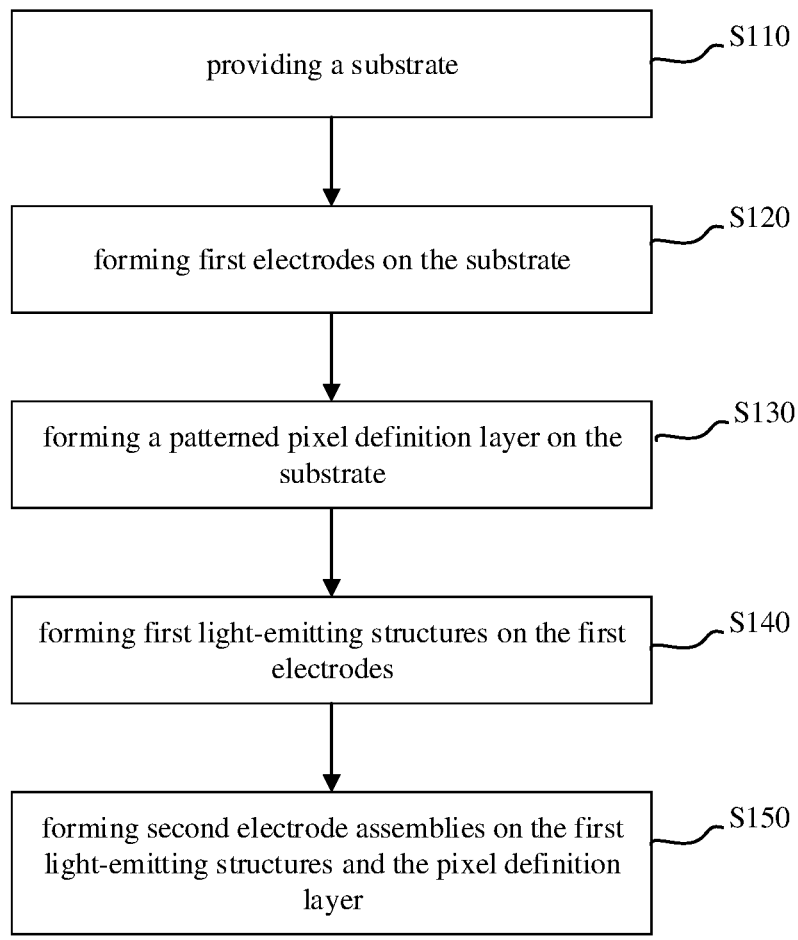
FIG. 4 is a flowchart of steps for forming a light-emitting element layer in a manufacturing method for a light-transmitting display panel according to an embodiment of the present application.

FIG. 4 is a flowchart of a manufacturing method for a light-transmitting display panel according to an embodiment of the present application. The manufacturing method includes step S110 to step S150.

At step S110, a substrate is provided, and in an implementation, a device layer may be formed on the substrate.

At step S120, a first electrode is formed on the substrate. In an implementation, after the device layer is formed on the substrate, the first electrode is formed on the device layer and patterned.

At step S130, a patterned pixel definition layer is formed on the substrate. In an implementation, the pixel definition layer may be formed on the device layer. The pixel definition layer includes a plurality of first pixel openings corresponding to respective locations of the first electrodes, and each of the first pixel openings exposes at least a part of a corresponding first electrode.

At step S140, are formed first light-emitting structures are formed on the first electrodes.

At step S150, are formed second electrode assemblies are formed on the first light-emitting structures and the pixel definition layer.

Figure 5:
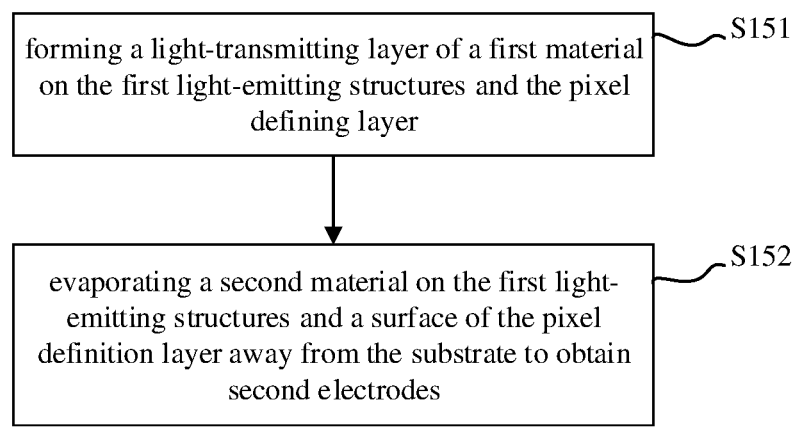
FIG. 5 is a flowchart of steps for forming second electrode assemblies in a manufacturing method for a light-transmitting display panel according to an embodiment of the present application.

FIG. 5 is a flowchart of steps for forming second electrode assemblies in a manufacturing method for a light-transmitting display panel according to an embodiment of the present application. The second electrode assemblies are formed on the first light-emitting structures and the pixel definition layer by step S151 to step S152.

At step S151, a light-transmitting layer of a first material is formed on the first light-emitting structures and the pixel definition layer. The light-transmitting layer includes a plurality of patterned light-transmitting blocks.

The first material may be, for example, an organic material such as Conductor Patterning Materials (CPM), and the plurality of patterned light-transmitting blocks may be formed by evaporation through a fine metal mask (Fine Metal Mask, FMM). The light-transmitting blocks may have a light (visible light) transmittance of 90% or greater. In an implementation, the light-transmitting blocks may have a thickness of 50 nanometers to 300 nanometers, preferably 80 nanometers to 130 nanometers, for example, 100 nanometers.

At step S152, a second material is evaporated on the first light-emitting structures and a surface of the pixel definition layer facing away from the substrate to obtain second electrodes. The second material nonbinds with the first material, such that the second electrodes includes multiple openings, within which the light-transmitting blocks are provided.

The second material may be a metal-like material such as Conductor Electrode Materials (CEM), for example, a magnesium-silver alloy. The CEM has a film-forming property that any film cannot be formed on the CPM, and has electrical and optical properties that are similar as electrical and optical properties of a conventional cathode. In an implementation, the second electrodes 1333 may have a thickness of 5 nanometers to 20 nanometers, preferably 10 nanometers to 16 nanometers, for example, 13 nanometers.

According to the manufacturing method for the light-transmitting display panel in the embodiment of the present application, the second material nonbinds with the first material, so during formation of the second electrodes, it can be prevented that any film would be formed in an area including the light-transmitting blocks due to nonbinding of the two materials, which enables precisely implementation of patterning of the second electrodes.

The embodiments of the present application also provide a display panel, which may be an OLED display panel. Hereinafter, the display panel according to the embodiment of the present application will be described in detail with reference to the drawings.

Figure 6:
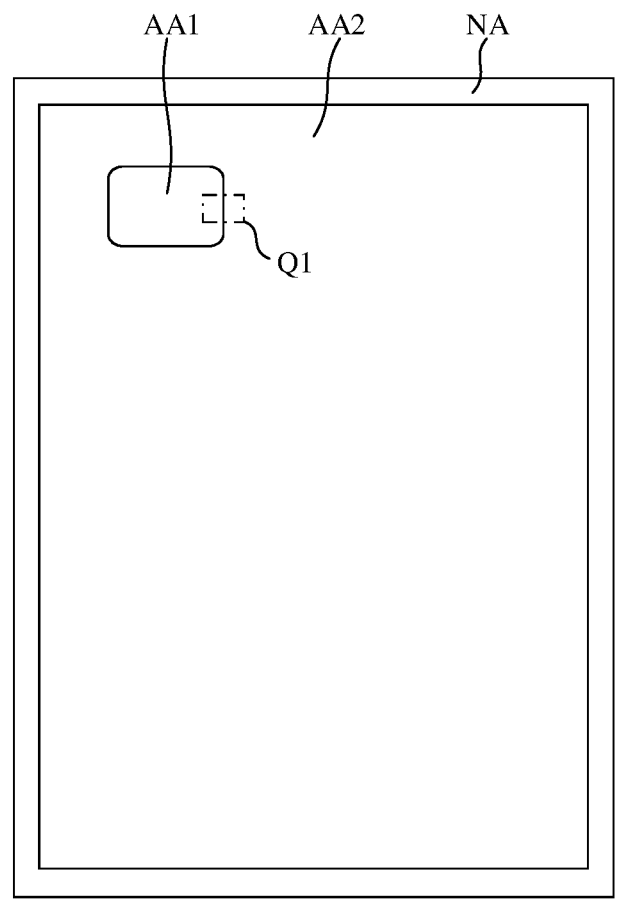
FIG. 6 is a schematic top view of a display panel according to an embodiment of the present application.
Figure 7:
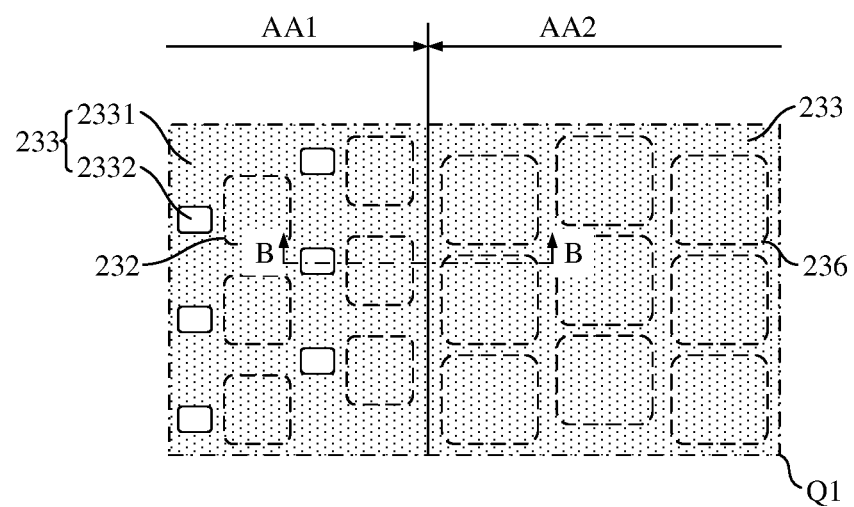
FIG. 7 is a partial enlarged view of the area Q1 in FIG. 6.
Figure 8:
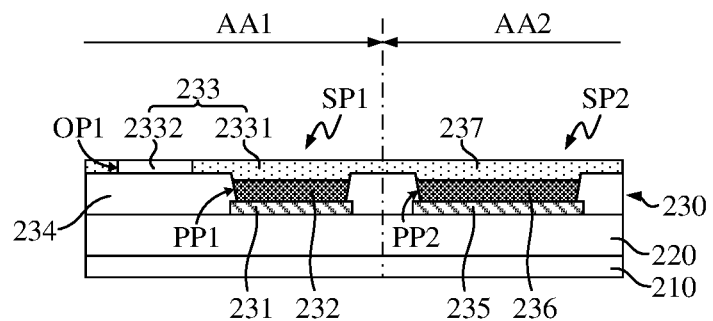
FIG. 8 is a sectional view taken along the line B-B in FIG. 7.

FIG. 6 is a schematic top view of a display panel according to an embodiment of the present application, FIG. 7 is a partial enlarged view of the Q1 area in FIG. 6, and FIG. 8 is a cross-sectional view in the direction of B-B in FIG. 7. The display panel 200 includes a substrate 210 and a light-emitting element layer 230 on the substrate 210. In an implementation, the display panel 200 may further include a device layer 220. The device layer 220 is provided on the substrate 210 and the light-emitting element layer 230 is provided on the device layer 220.

As shown in FIG. 6, the display panel 200 includes a first display area AA1 and a second display area AA2. The display panel 200 includes the first display area AA1 and the second display area AA2 in a plane parallel to the substrate 210. In an implementation, the display panel 200 may further include a non-display area NA surrounding outer periphery of the first display area AA1 and the second display area AA2. A light transmittance of the first display area AA1 is greater than a light transmittance of the second display area AA2. The first display area AA1 is provided with the light-transmitting display panel 100 according to any of the foregoing embodiments.

In the present application, it is preferable that the light transmittance of the first display area AA1 is 15% or greater than 15%. In order to ensure that the light-transmitting display panel 200 has a light transmittance of greater than 15%, even greater than 40%, and even has a higher light transmittance, each of functional film layers of the display panel 200 has a light transmittance of greater than 80% in the embodiment, and even at least a part of the functional film layers has a light transmittance of greater than 90%.

According to the display panel 200 in the embodiment of the present application, the light transmittance of the first display area AA1 is greater than the light transmittance of the second display area AA2, so that a photosensitive component can be integrated on a backside of the first display area AA1 of the display panel 200 to realize under-screen integration of a photosensitive component such as a camera, and further the first display area AA1 can display images, so a full-screen design of a display device can thus be achieved.

The light-emitting element layer 230 may include a plurality of first electrodes 231, a plurality of first light emitting structures 232 disposed on the first electrodes 231, and a plurality of second electrode assemblies 233 disposed on the first light emitting structures 232. The first electrodes 231, the first light-emitting structures 232 and the second electrode assemblies 233 included in the light-emitting element layer 230 are located in the first display area AA1. One of the first electrode 231 and the second electrode assembly 233 is an anode, and the other is a cathode. In the embodiment, a case where the first electrode 231 acts as an anode and the second electrode assembly 233 acts as a cathode is taken as an example for description. Each first electrode 231, together with a corresponding first light-emitting structure 232 and a second electrode assembly 233 in an area corresponding to the first light-emitting structure 232, forms a first light-emitting element SP1, which may be, for example, an OLED light-emitting element.

The second electrode assemblies 233 includes a plurality of second electrodes 2331 and a plurality of light-transmitting blocks 2332. The second electrodes 2331 are disposed on the first light emitting structures 232, and have a plurality of openings OP1, and the light-transmitting blocks 2332 are disposed in the openings OP1 of the select electrodes. A material of the light-transmitting block 2332 nonbinds with a material of the second electrode 2331, so during formation of the second electrodes 2331, it can be prevented that any film would be formed in an area including the light-transmitting blocks 1332 due to the nonbinding between the two materials, which enables precisely implementation patterning of the second electrodes 1332.

In an implementation, the light-transmitting blocks 2332 may have a light (visible light) transmittance of 90% or greater, so as to further increase an average light transmittance of the second electrode assemblies 233, thereby increasing the light transmittance of the first display area AA1.

In an implementation, the light-emitting element layer 230 may further include a pixel definition layer 234. The pixel definition layer 234 includes a plurality of first pixel openings PP1, and each of the first pixel openings PP1 accommodates a corresponding first light-emitting structure 232. In an implementation, the light-transmitting blocks 2332 and the first pixel openings PP1 may be staggered with each other on a plane parallel to the substrate 110, so that high light-transmittance areas and the light-emitting areas of the second electrode assemblies 233 avoid each other, to ensure higher display effects of the first display area AA1 while achieving a higher light transmittance. In an implementation, the light-transmitting blocks 2332 are configured in a plurality of columns, the first pixel openings PP1 are configured in a plurality of columns, and the plurality of columns of the light-transmitting blocks 2332 and the plurality of columns of the first pixel openings PP1 alternate with one another.

In an implementation, the light-emitting element layer 230 may further include a plurality of third electrodes 235, a plurality of second light-emitting structures 236 disposed on the third electrodes 235, and a plurality of fourth electrodes 237 disposed on the second light-emitting structures 236. The third electrodes 235, the second light-emitting structures 236 and the fourth electrodes 237 are located in the second display area AA2. The pixel definition layer 234 may further include a plurality of second pixel openings PP2, and each of the second pixel openings PP2 accommodates a corresponding second light-emitting structure 236.

One of the third electrode 235 and the fourth electrode 237 is an anode, and the other is a cathode. In the embodiment, a case where the third electrode 235 acts as an anode and the fourth electrode 237 acts as a cathode is taken as an example for description. Each third electrode 235, together with a corresponding second light-emitting structure 236 and a fourth electrode 237 in an area corresponding to the second light-emitting structure 236, forms a second light-emitting element SP2, which may be, for example, an OLED light-emitting element.

In an implementation, the second display area AA2 may be an active matrix driven display area, and the second light-emitting elements SP2 may be driven by respective corresponding pixel circuits to display.

The first light-emitting structure 232 and the second light-emitting structure 236 respectively include multiple light-emitting structures with different colors. In an implementation, the first light-emitting structure 232 may include a first red light-emitting structure 232, a first green light-emitting structure 232, and a first blue light-emitting structure. Likely, the second light emitting structure 236 includes a second red light-emitting structure 236, a second green light-emitting structure 236, and a second blue light-emitting structure 236.

In FIG. 7, outlines of the first light-emitting structures 232 and the second light-emitting structures 236 are respectively shown by dotted lines. In an implementation, a dimension of the first light-emitting structure 232 may be smaller than a dimension of the second light-emitting structure 236 when the first-light emitting structure 232 is of the same color as the second light-emitting structure 236, such that the first display area AA1 has enough areas for arranging high light-transmitting areas, so as to improve the light transmittance of the first display area AA1.

In the present application, the dimension of a component refers to a size of an area occupied by all structures contained (or designed) in the component on a light-transmitting display panel or a display surface of a display panel.

In an implementation, a ratio of the dimension of the first light-emitting structure 232 to the dimension of the second light-emitting structure 236 may be 0.25 to 0.6. The setting of such ratio can balance the light transmittance and service life of the first display area AA1, so as to enable the first display area AA1 to have sufficient light transmittance and service life.

In an implementation, the first electrodes 231 may have a same material and a same thickness with the third electrodes 235, and the second electrodes 2331 included in the second electrode assemblies 233 may have a same material and a same thickness with the fourth electrodes 237, so an electrode structure of the first light-emitting element SP1 in the first display area AA1 is approximately same as an electrode structure of the second light-emitting element SP2 in the second display area AA2, thereby making color coordinates and brightness of the first display area AA1 are approximately the same as color coordinates and brightness of the second display area AA2 at the same viewing angle, and improving display uniformity of the display panel 200.

In the above embodiment, the second display area AA2 of the display panel 200 is arranged around the first display area AA1, that is, the first display area AA1 is an offshore design. In an implementation, the first display area AA1 and the second display area AA2 may have any other positional relationship.

Figure 9:
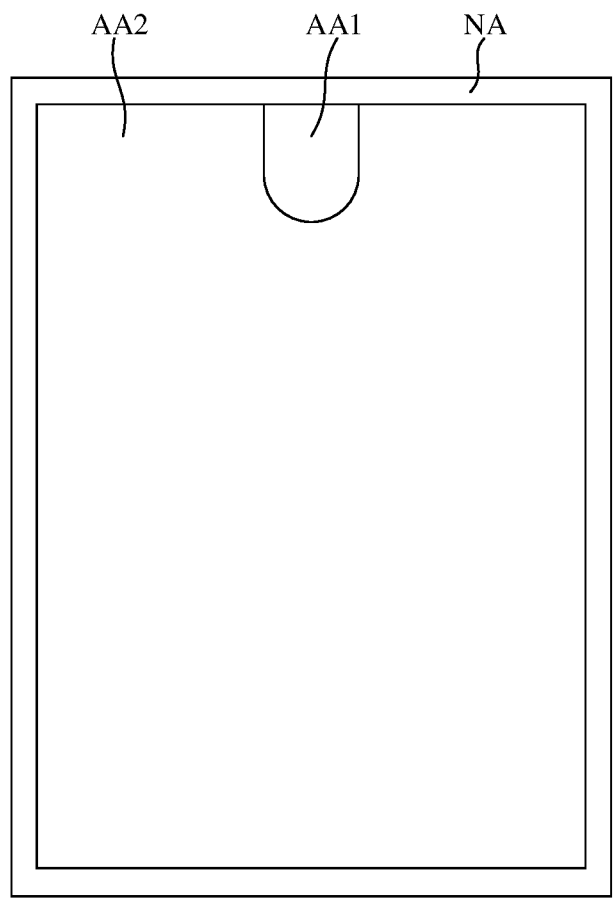
FIG. 9 is a schematic top view of a display panel according to an alternative embodiment of the present application.

FIG. 9 is a schematic top view of a display panel according to an alternative embodiment of the present application. The display panel 200 of the alternative embodiment includes a first display area AA1 and a second display area AA2. A light transmittance of the first display area AA1 is greater than a light transmittance of the second display area AA2. A non-display area NA is provided around the first display area AA1 and the second display area AA2. The first display area AA1 is arranged on one side edge of the second display area AA2, that is, the second display area AA2 is arranged around a part of periphery of the first display area AA1.

The embodiments of the present application also provide a manufacturing method for a display panel. The manufacturing method will be described below by taking manufacturing of the display panel 200 of the above-mentioned embodiment as an example.

Figure 10:
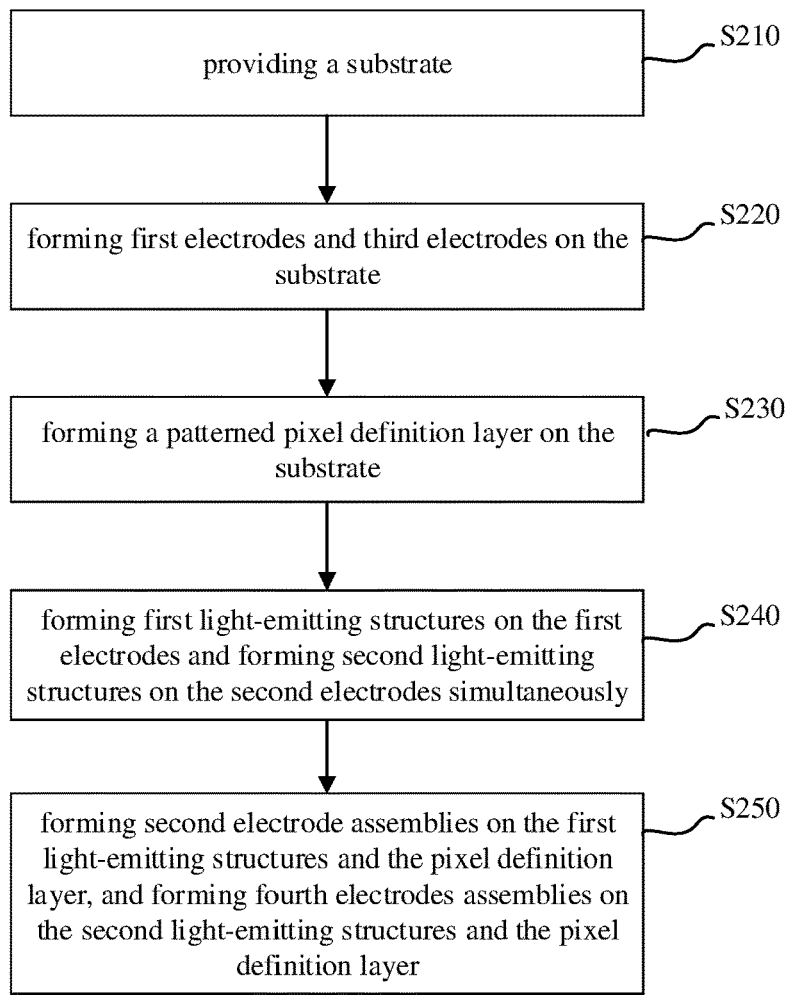
FIG. 10 is a flowchart of a manufacturing method for a display panel according to an embodiment of the present application.

FIG. 10 is a flowchart of a manufacturing method fora display panel according to an embodiment of the present application. The display panel includes a first display area and a second display area, and particularly the display panel includes the first display area and the second display area on a plane parallel to the substrate, and a light transmittance of the first display area is greater than a light transmittance of the second display area. The manufacturing method includes step S210 to step S250.

At step S210, a substrate is provided, and in an implementation, a device layer may be formed on the substrate.

At step S220, a plurality of first electrodes and a plurality of third electrodes are formed on the substrate. In an implementation, after the device layer is formed on the substrate, the first electrodes and the third electrodes may be formed on the device layer and patterned. The first electrodes are located in the first display area, and the third electrodes are located in the second display area.

At step S230, a patterned pixel definition layer is formed on the substrate. In an implementation, the pixel definition layer may be formed on the device layer. The pixel definition layer includes a plurality of first pixel openings corresponding to locations of the first electrodes and second pixel openings corresponding to locations of the second electrodes. Each of the first pixel openings exposes at least a part of a corresponding first electrode, and each of the second pixel openings exposes at least a part of a corresponding second electrode.

At step S240, a plurality of first light-emitting structures are formed on the first electrodes and a plurality of second light-emitting structures are formed on the third electrodes simultaneously.

At step S250, a plurality of second electrode assemblies are formed on the first light-emitting structures and the pixel definition layer, and a plurality of fourth electrodes are formed on the second light-emitting structures and the pixel definition layer simultaneously.

Figure 11:
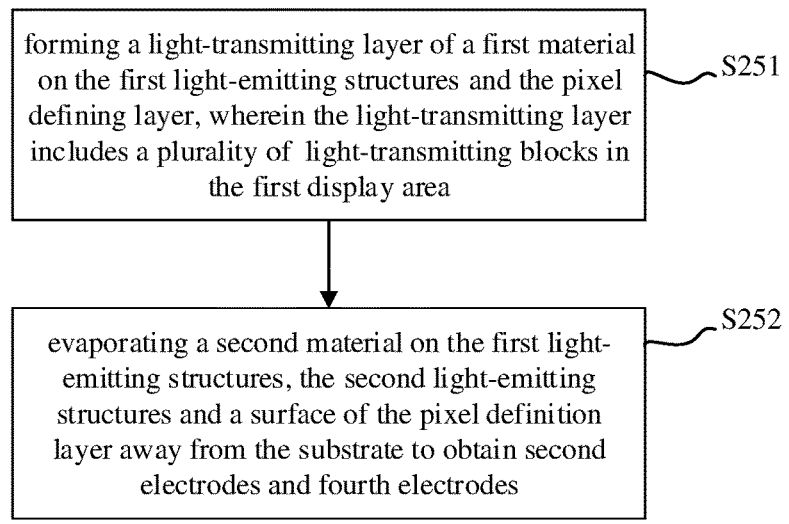
FIG. 11 is a flowchart of steps for forming second electrode assemblies and fourth electrodes in a manufacturing method manufacturing a light-transmitting display panel according to an embodiment of the present application.

FIG. 11 is a flowchart of steps for forming second electrode assemblies and fourth electrodes in a manufacturing method for a light-transmitting display panel according to an embodiment of the present application. The forming the second electrode assemblies on the first light-emitting structures and the pixel definition layer and forming the fourth electrodes on the second light-emitting structures and the pixel definition layer simultaneously includes step S251 to step S252.

At step S251, a light-transmitting layer of a first material is formed on the first light-emitting structures and the pixel definition layer. The light-transmitting layer includes a plurality of light-transmitting blocks located within the first display area.

The first material may be, for example, an organic material such as Conductor Patterning Materials (CPM), and the plurality of patterned light-transmitting blocks may be formed by evaporation through a fine metal mask (Fine Metal Mask, FMM). The light-transmitting blocks may have a light (visible light) transmittance of 90% or greater. In an implementation, the light-transmitting blocks may have a thickness of 50 nanometers to 300 nanometers, preferably 80 nanometers to 130 nanometers, for example, 100 nanometers.

At step S252, a second material is evaporated on the first light-emitting structures, the second light-emitting structures and a surface of the pixel definition layer facing away from the substrate to obtain second electrodes and fourth electrodes. The second material nonbinds with the first material, so that the second electrodes include multiple openings and the light-transmitting blocks are located within the openings.

The second material may be a metal-like material such as Conductor Electrode Materials (CEM), for example, a magnesium-silver alloy. The CEM has a film-forming property that any film cannot be formed on the CPM, and has electrical and optical properties that are similar as electrical and optical properties of a conventional cathode. In an implementation, the second electrodes 1333 may have a thickness of 5 nanometers to 20 nanometers, preferably 10 nanometers to 16 nanometers, for example, 13 nanometers.

According to the manufacturing method for the light-transmitting display panel in the embodiment of the present application, the second material nonbinds with the first material, so during formation of the second electrodes, it can be prevented that any film would be formed in an area including the light-transmitting blocks due to nonbinding of the two materials, which enables precisely implementation of patterning of the second electrodes.

According to the display panel 200 in the embodiment of the present application, the patterning of the second electrode 1331 is precisely implemented by taking advantages of the nonbinding between the materials, so that the second electrodes 1331 can be designed and patterned in more ways, and relative location between the first display area AA1 and the second display area AA2 can be more flexible.

Figure 12:
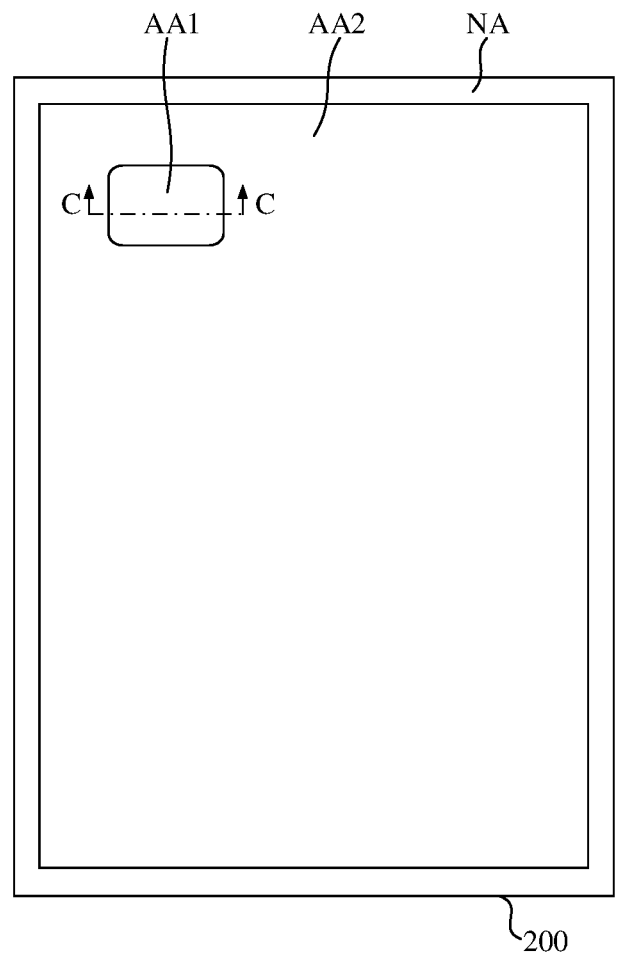
FIG. 12 is a schematic top view of a display device according to an embodiment of the present application.
Figure 13:
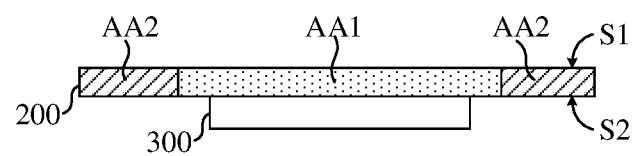
FIG. 13 is a cross-sectional view taken along the line C-C in FIG. 12.

The embodiments of the present application also provide a display device, which includes the light-transmitting display panel 100 according to any of the foregoing embodiments. A display device according to an embodiment will be described as an example. In the embodiment, the display device includes the display panel 200 in the foregoing embodiments, and the display panel in turn includes the light-transmitting display panel 100 in the foregoing embodiments FIG. 12 is a schematic top view of a display device according to an embodiment of the present application, and FIG. 13 is a cross-sectional view taken along the line C-C in FIG. 12. In the display device of the embodiment, the display panel 200 may be the display panel 200 according to any of the foregoing embodiments. The display panel 200 includes a first display area AA1 and a second display area AA2 in a plane parallel to the substrate 210 and a light transmittance of the first display area AA1 is greater than a light transmittance of the second display area AA2. The first display area AA1 is provided with the light-transmitting display panel 100 according to any of the foregoing embodiments.

The display panel 200 includes a first surface S1 and a second surface S2 opposite to each other, wherein the first surface S1 acts as a display surface. The display device further includes a photosensitive assembly 300, which is located at a side of the display panel 200 for the second surface S2, and corresponds to a location of the first display area AA1.

The photosensitive component 300 may be an image capturing device for capturing external image information. In the embodiment, the photosensitive component 300 may be a complementary metal oxide semiconductor (Complementary Metal Oxide Semiconductor, CMOS) image capturing device. In an implementation, the photosensitive component 300 may be any other image capturing device such as a Charge-Coupled Device (CCD) image capturing device. It should be understood that the photosensitive component 300 may not be limited to an image capturing device. For example, the photosensitive component 300 may be a light sensor such as an infrared sensor or a proximity sensor.

According to the display device of the embodiment of the present application, the light transmittance of the first display area AA1 is greater than the light transmittance of the second display area AA2, so that the photosensitive component 300 can be integrated on a backside of the first display area AA1 of the display panel 200 to realize under-screen integration of a photosensitive component such as an image capturing device, and further the first display area AA1 can display images to increase a display area of the display panel 200, so a full-screen design of a display device can thus be achieved.

The light-emitting element layer 230 includes a plurality of first electrodes 231 in the first display area AA1, a plurality of first light-emitting structures 232 disposed on the first electrodes 231, and a plurality of second electrode assemblies 233 disposed on the first light emitting structures 232. The second electrode assemblies 233 include a plurality of second electrodes 2331 and a plurality of light-transmitting blocks 2332. The second electrodes 2331 are located on the first light-emitting structures 232, and have a plurality of openings OP1, and the second electrodes 2331 include a first conductive material. The light-transmitting blocks 2332 are provided within the openings OP1. The light-transmitting blocks 2332 include a second light-transmitting material. The second material nonbinds with the first material, so that during forming of the second electrodes 2331, it can be prevented that any film would be formed in an area including the light-transmitting blocks 2332, which enables precisely implementation of patterning of the second electrodes.

According to the above-described embodiments of this application, these embodiments do not describe all the details in detail, nor do they limit this application to only the specific embodiments described. Obviously, many modifications and changes can be made based on the above description. In the description, these embodiments are selected and specifically described in order to better explain principles and practical applications of this application, so that those skilled in the art can make good use of this application and make modifications based on this application. This application is only limited by the claims and their full scope and equivalents.

What is claimed is:

1. A light-transmitting display panel comprising:
 a first display area;
 a second display area, wherein a light transmittance of the first display area is greater than a light transmittance of the second display area;
 a substrate;
 a light-emitting element layer disposed on the substrate, wherein the light-emitting element layer comprises a plurality of first electrodes, a plurality of first light-emitting structures disposed on the plurality of first electrodes, at least one second electrode assembly is disposed on the plurality of first light-emitting structures, and
 a pixel definition layer, wherein the pixel definition layer comprises a plurality of first pixel openings and each of the plurality of first pixel openings accommodates a corresponding one of the plurality of first light-emitting structures, and
 the at least one second electrode assembly comprises:
 at least one second electrode disposed on the plurality of first light-emitting structures and having a plurality of openings disposed on the first display area, and the plurality of openings and the plurality of first pixel openings are separate from each other on a plane parallel to the substrate,
 wherein light-transmitting materials are disposed in the openings of the at least one second electrode, and the openings of the at least one second electrode and the plurality of first pixel openings are staggered with each other on a plane parallel to the substrate.

2. The light-transmitting display panel according to claim 1, wherein the plurality of first pixel openings is adjacent to the plurality of openings, and each of the first pixel openings is surrounded by corresponding ones of the plurality of openings, or each of the plurality of openings is surrounded by corresponding ones of the first pixel openings.

3. The light-transmitting display panel according to claim 1, wherein the plurality of openings is configured in a first plurality of columns, the plurality of first pixel openings is configured in a second plurality of columns, and the first plurality of columns of the openings and the second plurality of columns of the first pixel openings alternate with one another.

4. The light-transmitting display panel according to claim 1, wherein an irregularly shaped spacer region is formed between orthographic projections of the plurality of first light-emitting structures on the substrate and orthographic projections of the plurality of openings disposed with the light-transmitting materials are adjacent to the plurality of first light-emitting structures on the substrate.

5. The light-transmitting display panel according to claim 4, wherein each of the orthographic projections of the plurality of openings disposed with the light-transmitting materials on the substrate comprises one first graphic unit or two or more first graphic units, wherein the first graphic unit comprises at least one selected from a group consisting of a polygon, a dumbbell-like shape, a gourd-like shape, and a wave-like shape.

6. The light-transmitting display panel according to claim 4, wherein each of the orthographic projections of the plurality of first light-emitting structures on the substrate consists of one second graphic unit or two or more second graphic units, wherein the second graphic unit comprises at least one selected from a group comprising a circle, an oval, a dumbbell-like shape, a gourd-like shape, and a rectangle.

7. The light-transmitting display panel according to claim 1, wherein the light-transmitting materials have a light transmittance of 90% or greater; and
 the light-transmitting materials have a thickness of 50 nanometers to 300 nanometers.

8. The light-transmitting display panel according to claim 1, wherein the plurality of first electrodes comprises light-transmitting electrodes or reflective electrodes.

9. The light-transmitting display panel according to claim 1, wherein the second electrodes are magnesium-silver alloy layers.

10. The light-transmitting display panel according to claim 1, wherein the second electrodes have a thickness of 5 nanometers to 20 nanometers.

11. The display panel according to claim 1, wherein the plurality of first electrodes, the plurality of first light-emitting structures and the at least one second electrode assembly in the light-emitting element layer are located in the first display area, the light-emitting element layer further comprises a plurality of third electrodes, a plurality of second light-emitting structures disposed on the plurality of third electrodes and a plurality of fourth electrodes disposed on the plurality of second light-emitting structures, the plurality of third electrodes, the plurality of second light-emitting structures and the plurality of fourth electrodes are located in the second display area, and a dimension of the plurality of first light-emitting structures is smaller than a dimension of the plurality of second light-emitting structures when the plurality of first light-emitting structures is of the same color as the plurality of second light-emitting structures.

12. The display panel according to claim 11, wherein a ratio of the dimension of the plurality of first light-emitting structures to the dimension of the plurality of second light-emitting structures is 0.25 to 0.6.

13. The display panel according to claim 11, wherein the plurality of first electrodes has a same material and a same thickness with the plurality of third electrodes.

14. The display panel according to claim 11, wherein the at least one of second electrode in the at least one second electrode assembly has a material and a thickness same to that of the plurality of fourth electrodes.

15. The display panel according to claim 1, wherein the second display area is an active matrix driven display area.

16. A display panel comprising:
a substrate;
a light-emitting element layer disposed on the substrate, wherein the light-emitting element layer comprises
a plurality of first electrodes,
a plurality of first light-emitting structures disposed on the plurality of first electrodes,
at least one second electrode assembly disposed on the plurality of first light-emitting structures that comprises at least one second electrode disposed on the plurality of first light-emitting structures and having a plurality of openings, in a first direction, a minimum distance between two adjacent openings is greater than a size of the first pixel opening, in a second direction, a minimum distance between two adjacent openings is greater than a size of the first pixel opening, and the first direction crosses the second direction; and
a pixel definition layer comprises a plurality of first pixel openings and each of the plurality of first pixel openings accommodates a corresponding one of the plurality of first light-emitting structures.

17. The display panel of claim 16, wherein, in the first direction or the second direction, a distance from an edge of the opening to an edge of an adjacent pixel is different, and the first direction and the second direction cross to form a horizontal plane.

18. A display panel comprising:
a substrate;
a light-emitting element layer disposed on the substrate, wherein the light-emitting element layer comprises
a plurality of first electrodes,
a plurality of first light-emitting structures disposed on the plurality of first electrodes,
at least one second electrode assembly is disposed on the plurality of first light-emitting structures that comprises at least one second electrode disposed on the plurality of first light-emitting structures and having a plurality of openings, the openings are set at column intervals, and two adjacent rows of the openings are misaligned in a row direction.

* * * * *